United States Patent
Kim

(10) Patent No.: US 9,412,297 B2
(45) Date of Patent: Aug. 9, 2016

(54) ORGANIC LIGHT EMITTING DIODE DISPLAY AND METHOD OF MANUFACTURING THE SAME

(71) Applicant: SAMSUNG DISPLAY CO., LTD., Yongin, Gyeonggi-Do (KR)

(72) Inventor: Deok-Hoi Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 383 days.

(21) Appl. No.: 14/014,681

(22) Filed: Aug. 30, 2013

(65) Prior Publication Data

US 2014/0118232 A1 May 1, 2014

(30) Foreign Application Priority Data

Oct. 26, 2012 (KR) ........................ 10-2012-0119731

(51) Int. Cl.
*G09G 3/32* (2016.01)
*H01L 27/12* (2006.01)

(52) U.S. Cl.
CPC ............ *G09G 3/3233* (2013.01); *H01L 27/124* (2013.01); *G09G 2300/0426* (2013.01); *G09G 2300/0819* (2013.01); *G09G 2300/0842* (2013.01); *G09G 2300/0861* (2013.01)

(58) Field of Classification Search
CPC . H01L 27/3258; H01L 27/32; H01L 27/3225; H01L 27/3209; H01L 51/56; H01L 29/78621; H01L 27/127; H01L 27/3262; H01L 27/14; G09G 3/3208; G09G 3/3233; G09G 2300/0426; G09G 2300/0819; G09G 2300/0842; G09G 2300/0861

USPC ............ 345/82, 76; 438/23, 34; 257/40, 184, 257/187, 257, 258, 290, 291
See application file for complete search history.

(56) References Cited

U.S. PATENT DOCUMENTS

| 6,914,642 | B2 | 7/2005 | Yamazaki et al. | |
|---|---|---|---|---|
| 2006/0145960 | A1* | 7/2006 | Koga | G09G 3/3233 345/76 |
| 2011/0207248 | A1* | 8/2011 | Yamazaki | H01L 27/3244 438/23 |
| 2012/0098008 | A1* | 4/2012 | Song | H01L 27/3258 257/98 |
| 2012/0127220 | A1* | 5/2012 | Noguchi | G09G 3/3233 345/690 |

(Continued)

FOREIGN PATENT DOCUMENTS

KR  10-0297868 B1  5/2001
KR  10-2004-0038729 A  5/2004

(Continued)

*Primary Examiner* — Amare Mengistu
*Assistant Examiner* — Stacy Khoo
(74) *Attorney, Agent, or Firm* — Lee & Morse, P.C.

(57) ABSTRACT

An organic light emitting diode display includes a pixel portion displaying an image and a peripheral portion surrounding the pixel portion, a semiconductor layer including a pixel switching semiconductor layer on the pixel portion on the substrate, a being driving semiconductor layer, and a peripheral switching semiconductor layer on the peripheral portion, a first gate insulating layer on the semiconductor layer, a peripheral switching gate electrode on the first gate insulating layer of the peripheral portion, a second gate insulating layer covering the peripheral switching gate electrode and the first gate insulating layer, a pixel switching gate electrode and a driving gate electrode on the second gate insulating layer of the pixel portion, and a third gate insulating layer covering the pixel switching gate electrode, the driving gate electrode, and the second gate insulating layer.

18 Claims, 14 Drawing Sheets

(56) References Cited

U.S. PATENT DOCUMENTS

2012/0147060 A1* 6/2012 Jeong .................. G09G 3/3233
                                                           345/690

FOREIGN PATENT DOCUMENTS

| KR | 10-2006-0058920 A | 6/2006 |
| KR | 10-2006-0114459 A | 11/2006 |

* cited by examiner

ORGANIC LIGHT EMITTING DIODE DISPLAY AND METHOD OF MANUFACTURING THE SAME

CROSS-REFERENCE TO RELATED APPLICATION

This application claims priority to and the benefit of Korean Patent Application No. 10-2012-0119731 filed in the Korean Intellectual Property Office on Oct. 26, 2012, and entitled: "Organic Light Emitting Diode Display and Method of Manufacturing the Same," the entire contents of which are incorporated herein by reference.

BACKGROUND

An organic light emitting diode display may include two electrodes and an organic emission layer interposed therebetween. Electrons injected from one of the electrodes and holes injected from the other of the electrodes are bonded to each other in the organic emission layer to form an exciton, and light is emitted while the exciton discharges energy.

The above information disclosed in this Background section is only for enhancement of understanding of the background of the described technology and therefore it may contain information that does not form the prior art that is already known in this country to a person of ordinary skill in the art.

SUMMARY

Embodiments may be realized by providing an organic light emitting diode display that includes a substrate including a pixel portion displaying an image and a peripheral portion surrounding the pixel portion, a semiconductor layer including a pixel switching semiconductor layer formed on the pixel portion on the substrate, a driving semiconductor layer, and a peripheral switching semiconductor layer formed on the peripheral portion, a first gate insulating layer formed on the semiconductor layer, a peripheral switching gate electrode formed on the first gate insulating layer of the peripheral portion, a second gate insulating layer covering the peripheral switching gate electrode and the first gate insulating layer, a pixel switching gate electrode and a driving gate electrode formed on the second gate insulating layer of the pixel portion, and a third gate insulating layer covering the pixel switching gate electrode, the driving gate electrode, and the second gate insulating layer, in which the driving semiconductor layer may be bent.

The organic light emitting diode display may further include a storage capacitor overlapping the driving semiconductor layer. The storage capacitor may include a first storage capacitive plate formed on the second gate insulating layer and overlapping the driving semiconductor layer, and a second storage capacitive plate formed on the third gate insulating layer covering the first storage capacitive plate and overlapping the first storage capacitive plate.

The driving semiconductor layer may include a plurality of bent portions. The driving semiconductor layer may include a plurality of first extension portions extending in a first direction and a plurality of second extension portions extending in a second direction that is different from the first direction, and the bent portions may connect the first extension portions and the second extension portions.

The organic light emitting diode display may further include a scan line formed on the substrate and transferring a scan signal, a data line and a driving voltage line crossing the scan line and transferring a data signal and a driving voltage, respectively, a pixel switching transistor connected to the scan line and the data line and including the pixel switching semiconductor layer and the pixel switching gate electrode, a driving transistor connected to a pixel switching drain electrode of the pixel switching transistor and including the driving semiconductor layer and the driving gate electrode, and an organic light emitting diode connected to a driving drain electrode of the driving transistor.

The organic light emitting diode display may further include: a peripheral switching transistor including the peripheral switching semiconductor layer and the peripheral switching gate electrode, in which the first gate insulating layer may be formed between the peripheral switching semiconductor layer and the peripheral switching gate electrode of the peripheral switching transistor.

The first gate insulating layer and the second gate insulating layer may be formed between the pixel switching semiconductor layer and the pixel switching gate electrode of the pixel switching transistor. The first gate insulating layer and the second gate insulating layer may be formed between the driving semiconductor layer and the driving gate electrode of the driving transistor.

The organic light emitting diode display may further include: a compensation transistor compensating a threshold voltage of the driving transistor and connected to the driving transistor. The organic light emitting diode display may further include a light emission control transistor turned-on by a light emission control signal transferred by a light emission control line to transfer the driving voltage from the driving transistor to the organic light emitting diode, in which the light emission control transistor may be positioned between the driving drain electrode of the driving transistor and the organic light emitting diode.

The organic light emitting diode display may further include: an interlayer insulating layer covering the second storage capacitive plate, a connection member formed on the interlayer insulating layer and connected through a contact hole formed in the third gate insulating layer and the interlayer insulating layer to the first storage capacitive plate, and a protective layer covering the interlayer insulating layer and the connection member, in which the connection member may be connected to a compensation drain electrode of the compensation transistor.

The scan line may be formed on the same layer as the first storage capacitive plate, and the data line and the driving voltage line may be formed on the same layer as the connection member. The driving voltage line may be connected through a contact hole formed in the interlayer insulating layer to the second storage capacitive plate.

The organic light emitting diode display may further include an operation control transistor turned-on by the light emission control signal transferred by the light emission control line to transfer the driving voltage to the driving transistor, in which the operation control transistor may be positioned between the driving voltage line and a driving source electrode of the driving transistor.

The organic light emitting diode display may further include an initialization transistor turned-on according to a prior scan signal transferred through a prior scan line to transfer an initialization voltage to the driving gate electrode of the driving transistor, in which the initialization transistor may be positioned between the initialization voltage line and the driving gate electrode of the driving transistor.

Embodiments may also be realized by providing a method of manufacturing an organic light emitting diode display that includes forming a pixel switching semiconductor layer and a bent driving semiconductor layer on a pixel portion on a substrate including the pixel portion and a peripheral portion, and forming a peripheral switching semiconductor layer on the peripheral portion, forming a first gate insulating layer on the pixel switching semiconductor layer, the driving semiconductor layer, and the peripheral switching semiconductor layer, forming a peripheral switching gate electrode on the first gate insulating layer of the peripheral portion, forming a second gate insulating layer covering the peripheral switching gate electrode and the first gate insulating layer, forming a pixel switching gate electrode and a driving gate electrode on the second gate insulating layer of the pixel portion, and forming a third gate insulating layer covering the pixel switching gate electrode, the driving gate electrode, and the second gate insulating layer.

The method may further include forming a storage capacitor overlapping the driving semiconductor layer. The forming of the storage capacitor may include forming a first storage capacitive plate overlapping the driving semiconductor layer on the second gate insulating layer, and forming a second storage capacitive plate overlapping the first storage capacitive plate on the third gate insulating layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
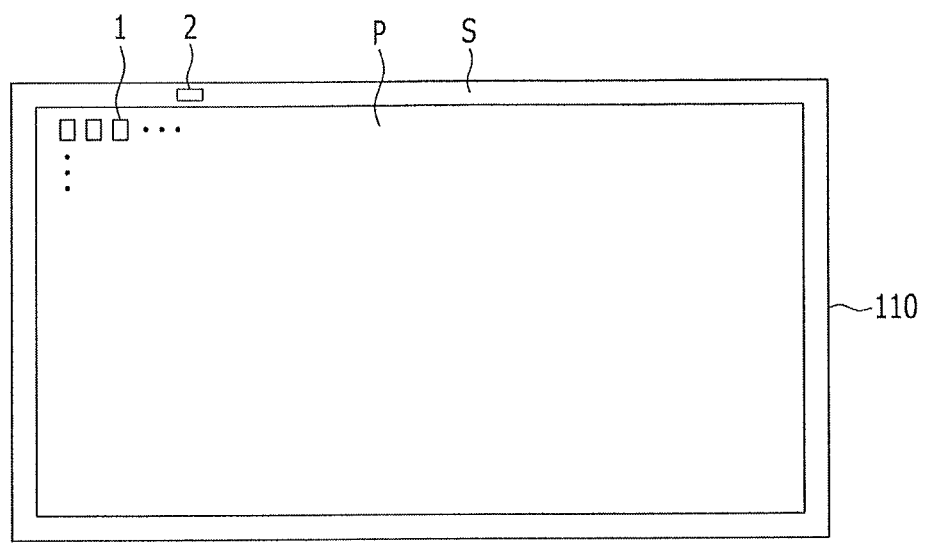
FIG. 1 is a top plan view of an organic light emitting diode display according to an exemplary embodiment.

Embodiments will be described more fully hereinafter with reference to the accompanying drawings, in which exemplary embodiments are shown. As those skilled in the art would realize, the described embodiments may be modified in various different ways, all without departing from the spirit or scope of the embodiments.

The drawings and description are to be regarded as illustrative in nature and not restrictive. Like reference numerals designate like elements throughout the specification. Further, the size and thickness of each component shown in the drawings are arbitrarily shown for understanding and ease of description, but embodiments are not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, in the specification, the word "on" means positioning on or below the object portion, but does not essentially mean positioning on the upper side of the object portion based on a gravity direction.

Further, in the specification, the word "on a flat surface" means when an object portion is viewed from the above, and the word "on a cross section" means when a cross section taken by vertically cutting an object portion is viewed from the side.

Then, an organic light emitting diode display according to an exemplary embodiment will be described in detail with reference to FIGS. 1 to 8.

Figure 2:
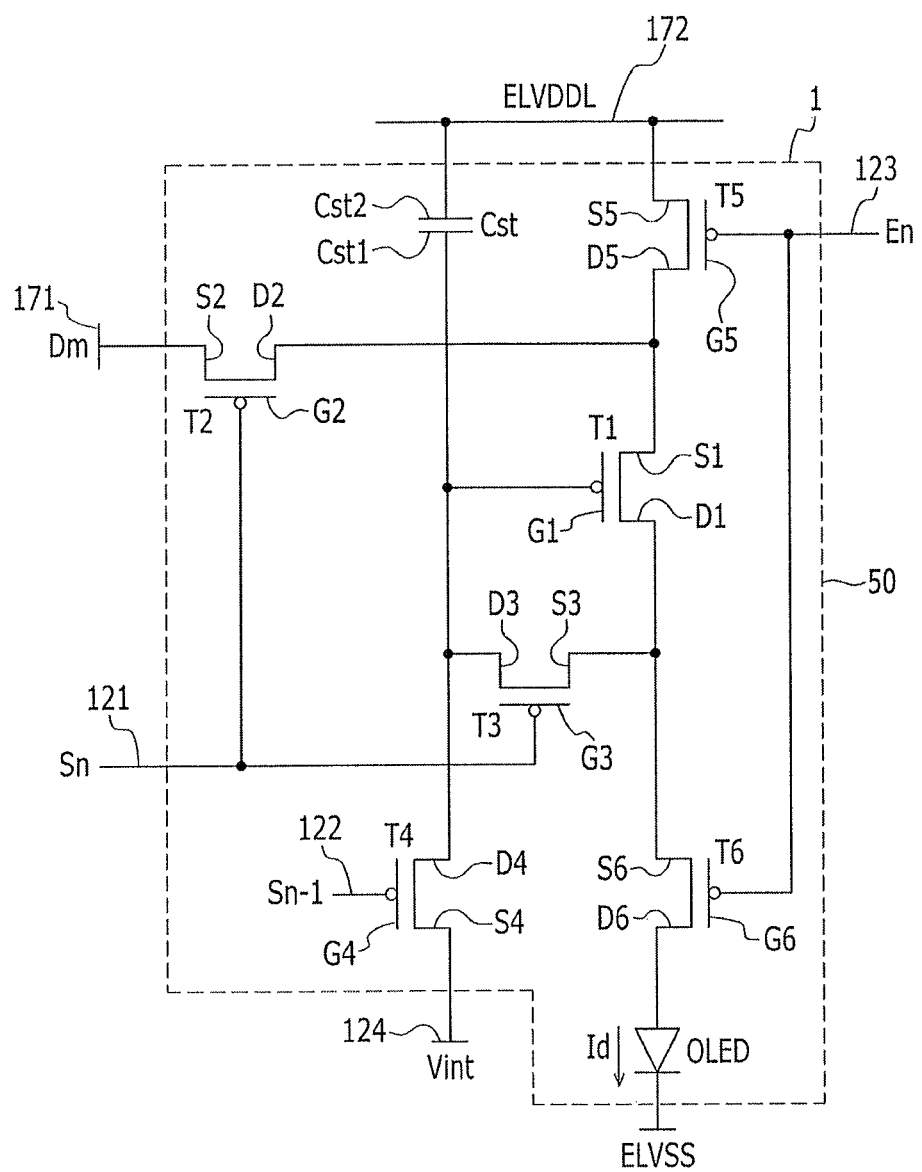
FIG. 2 is an equivalent circuit of one pixel of a pixel portion of the organic light emitting diode display according to the exemplary embodiment.

FIG. 1 is a top plan view of an organic light emitting diode display according to an exemplary embodiment, and FIG. 2 is an equivalent circuit of one pixel of a pixel portion of the organic light emitting diode display according to the exemplary embodiment.

As illustrated in FIG. 1, the organic light emitting diode display according to the exemplary embodiment includes a pixel portion P formed on a substrate 110, which pixel portion P includes a plurality of pixels 1 formed of an organic light emitting diode (OLED), and a peripheral portion S surrounding the pixel portion P, which peripheral portion includes a plurality of peripheral circuits 2.

As illustrated in FIG. 2, one pixel 1 formed in the pixel portion P of the organic light emitting diode display according to the exemplary embodiment includes a plurality of signal lines 121, 122, 123, 124, 171, and 172, and a plurality of transistors T1, T2, T3, T4, T5, and T6, a storage capacitor Cst, and an organic light emitting diode (OLED) connected to a plurality of signal lines.

The transistor includes a driving transistor (driving thin film transistor) T1, a pixel switching transistor (switching thin film transistor) T2, a compensation transistor T3, an initialization transistor T4, an operation control transistor T5, and a light emission control transistor T6.

The signal line includes a scan line 121 transferring a scan signal Sn, a prior scan line 122 transferring a prior scan signal Sn−1 to the initialization transistor T4, a light emission control line 123 transferring a light emission control signal En to the operation control transistor T5 and the light emission control transistor T6, a data line 171 crossing the scan line 121 and transferring a data signal Dm, a driving voltage line 172 transferring a driving voltage ELVDD and formed substantially parallel to the data line 171, and an initialization voltage line 124 transferring an initialization voltage Vint initializing the driving transistor T1.

A gate electrode G1 of the driving transistor T1 is connected to an end Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED). The driving transistor T1 receives the data signal Dm according to switching operation of the pixel switching transistor T2 to supply a driving current Id to the organic light emitting diode (OLED).

A gate electrode G2 of the pixel switching transistor T2 is connected to the scan line 121, a source electrode S2 of the pixel switching transistor T2 is connected to the data line 171, and a drain electrode D2 of the pixel switching transistor T2 is connected via the operation control transistor T5 to the driving voltage line 172 while being connected to the source electrode S1 of the driving transistor T1. The pixel switching transistor T2 is turned-on according to the scan signal Sn transferred through the scan line 121 to perform switching operation transferring the data signal Dm transferred to the data line 171 to the source electrode of the driving transistor T1.

A gate electrode G3 of the compensation transistor T3 is connected to the scan line 121, a source electrode S3 of the compensation transistor T3 is connected via the light emission control transistor T6 to the anode of the organic light emitting diode (OLED) while being connected to the drain electrode D1 of the driving transistor T1, and a drain electrode D3 of the compensation transistor T3 is connected to an end Cst1 of the storage capacitor Cst, a drain electrode D4 of the initialization transistor T4, and the gate electrode G1 of the driving transistor T1 together. The compensation transistor T3 is turned-on according to the scan signal Sn transferred through the scan line 121 to connect the gate electrode G1 and the drain electrode D1 of the driving transistor T1 to each other, thus performing diode-connection of the driving transistor T1.

The gate electrode G4 of the initialization transistor T4 is connected to the prior scan line 122, the source electrode S4 of the initialization transistor T4 is connected to the initialization voltage line 124, and the drain electrode D4 of the initialization transistor T4 is connected to an end Cst1 of the storage capacitor Cst, the drain electrode D3 of the compensation transistor T3, and the gate electrode G1 of the driving transistor T1 together. The initialization transistor T4 is turned-on according to the prior scan signal Sn−1 transferred through the prior scan line 122 to transfer the initialization voltage Vint to the gate electrode G1 of the driving transistor T1, thus performing an initialization operation initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode S2 of the pixel switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned-on according to the light emission control signal En transferred through the light emission control line 123 to transfer the driving voltage ELVDD to the organic light emitting diode (OLED), thus allowing the driving current Id to flow in the organic light emitting diode (OLED).

Another end Cst2 of the storage capacitor Cst is connected to the driving voltage line 172, and a cathode of the organic light emitting diode (OLED) is connected to a common voltage ELVSS. Accordingly, the organic light emitting diode (OLED) receives the driving current Id from the driving transistor T1 to emit light, thereby displaying an image.

Hereinafter, a specific operation process of one pixel of the organic light emitting diode display according to the exemplary embodiment will be described in detail.

First, the prior scan signal Sn−1 at a low level is supplied through the prior scan line 122 during an initialization period. Then, the initialization transistor T4 is turned-on corresponding to the prior scan signal Sn−1 at the low level, and the initialization voltage Vint is connected from the initialization voltage line 124 through the initialization transistor T4 to the gate electrode of the driving transistor T1 to initialize the driving transistor T1 by the initialization voltage Vint.

Subsequently, the scan signal Sn at the low level is supplied through the scan line 121 during a data programming period. Then, the pixel switching transistor T2 and the compensation transistor T3 are turned-on corresponding to the scan signal Sn at the low level.

In this case, the driving transistor T1 is diode-connected by the turned-on compensation transistor T3, and biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode of the driving transistor T1.

The driving voltage ELVDD and the compensation voltage Dm+Vth are applied to both ends of the storage capacitor Cst, and a charge corresponding to a difference between voltages at both ends is stored in the storage capacitor Cst. Thereafter, the level of the light emission control signal En supplied from the light emission control line 123 during the light emission period is changed from the high level to the low level. Then, the operation control transistor T5 and the light emission control transistor T6 are turned-on by the light emission control signal En at the low level during the light emission period.

Then, the driving current Id is generated according to a difference between the voltage of the gate electrode of the driving transistor T1 and the driving voltage ELVDD, and the driving current Id is supplied through the light emission control transistor T6 to the organic light emitting diode (OLED). The gate-source voltage Vgs of the driving transistor T1 is maintained at '(Dm+Vth)-ELVDD' by the storage capacitor Cst during the light emission period, and the driving current Id is proportional to a square of a value obtained by subtracting the threshold voltage from the source-gate voltage, that is, '(Dm-ELVDD)$^2$', according to a current-voltage relationship of the driving transistor T1. Accordingly, the driving current Id is determined regardless of the threshold voltage Vth of the driving transistor T1.

Then, a detailed structure of the pixel of the pixel portion of the organic light emitting diode display illustrated in FIG. 2 and a detailed structure of the switching transistor of the peripheral portion will be described in detail with reference to FIGS. 3 to 8 and FIG. 2 together.

Figure 3:
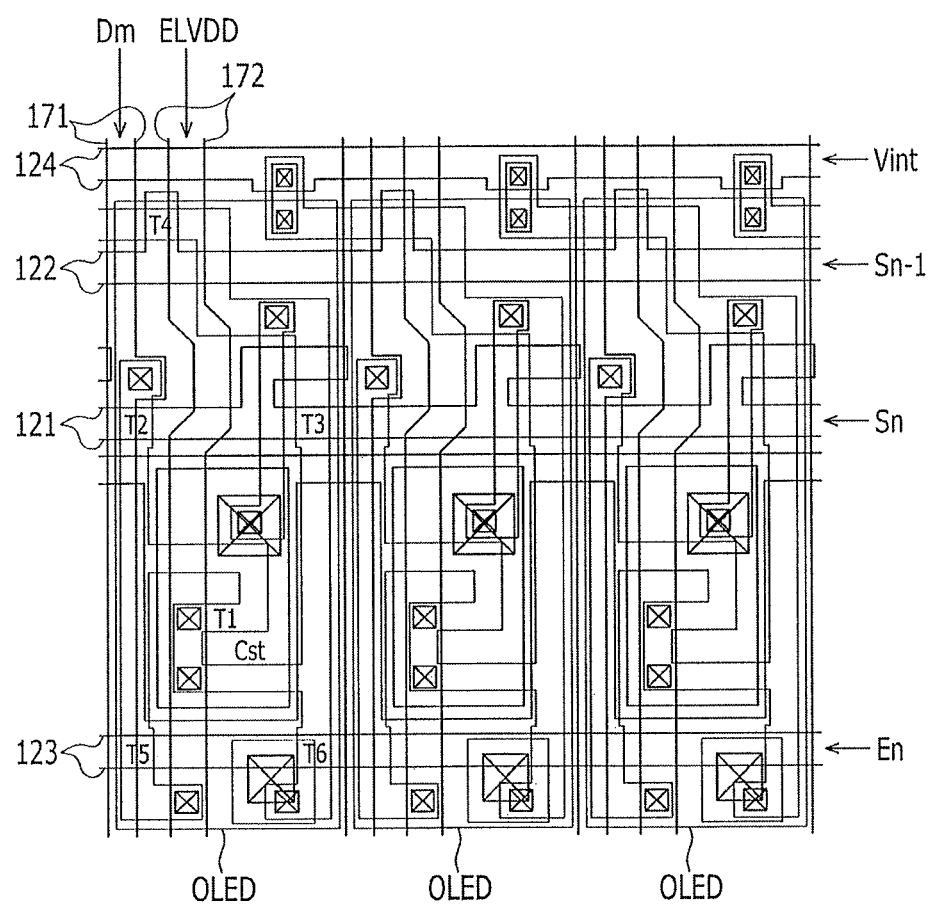
FIG. 3 is a view schematically illustrating a plurality of transistors and capacitors of the pixel portion of the organic light emitting diode display according to the exemplary embodiment.
Figure 4:
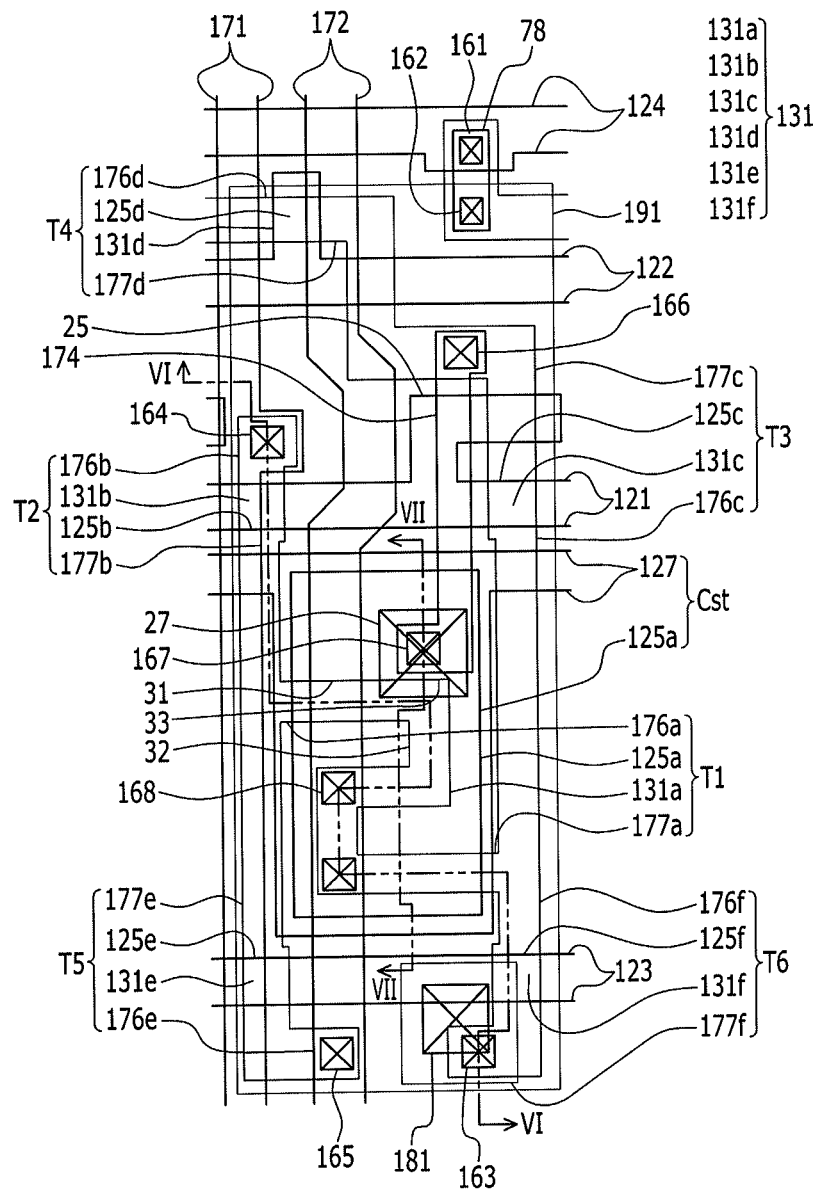
FIG. 4 is a specific layout view of one pixel of FIG. 3.
Figure 5:
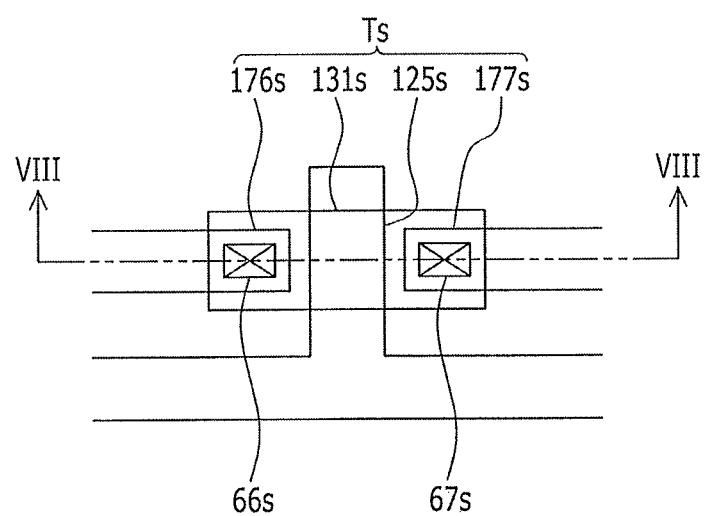
FIG. 5 is a view schematically illustrating a switching transistor of a peripheral portion of the organic light emitting diode display according to the exemplary embodiment.
Figure 6:
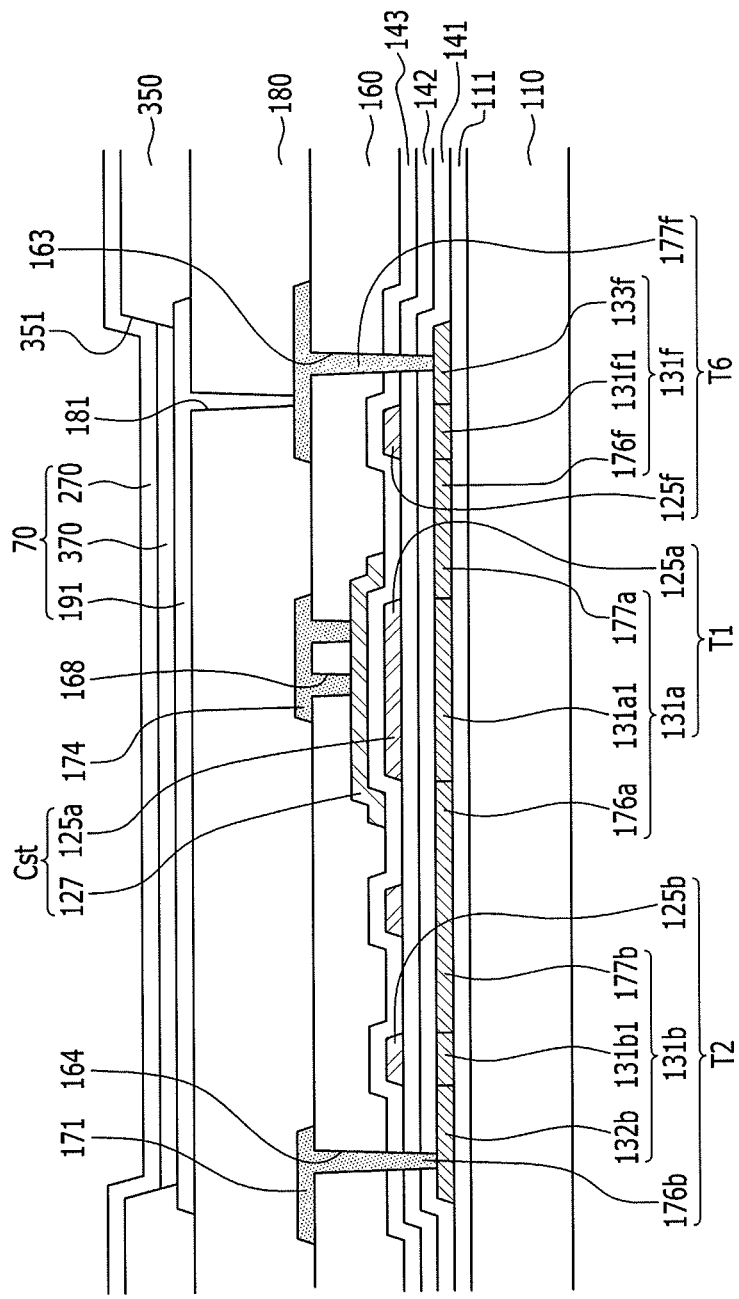
FIG. 6 is a cross-sectional view of the organic light emitting diode display of FIG. 4, which is taken along line VI-VI.
Figure 7:
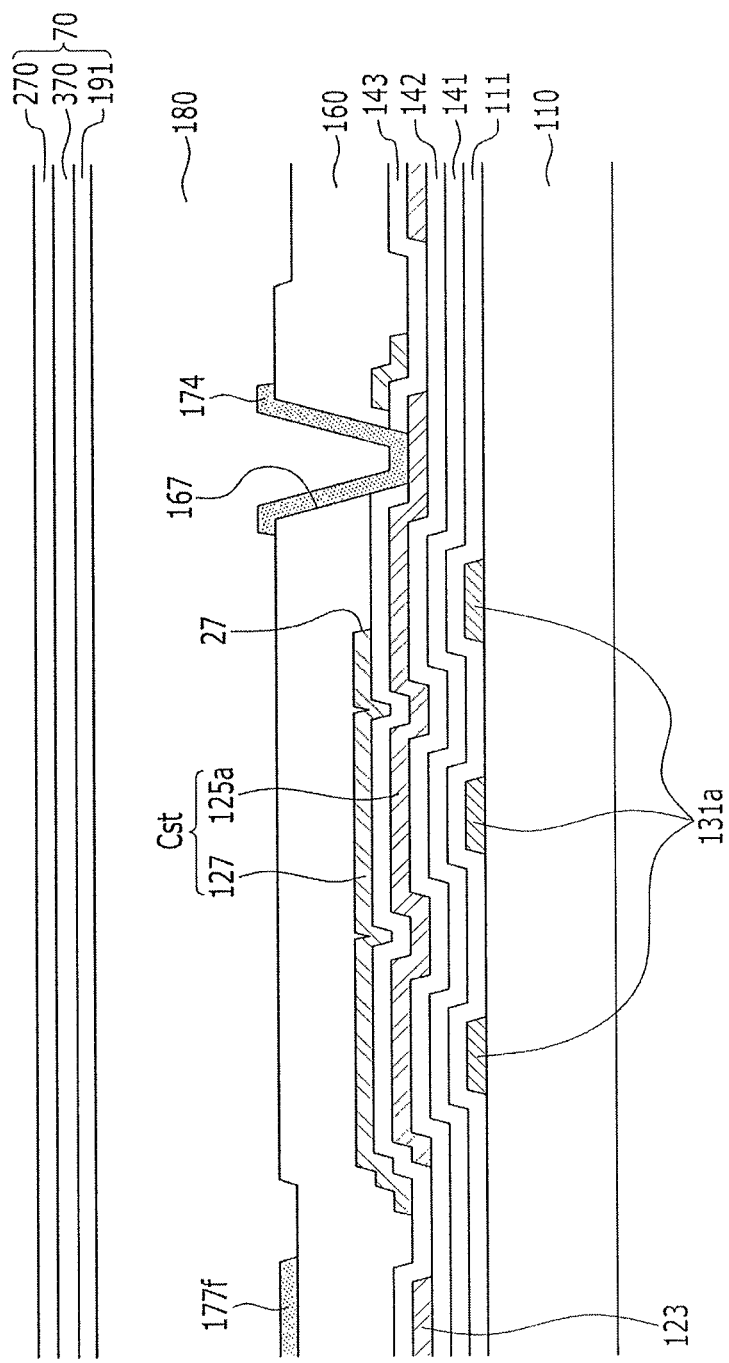
FIG. 7 is a cross-sectional view of the organic light emitting diode display of FIG. 4, which is taken along line VII-VII.
Figure 8:
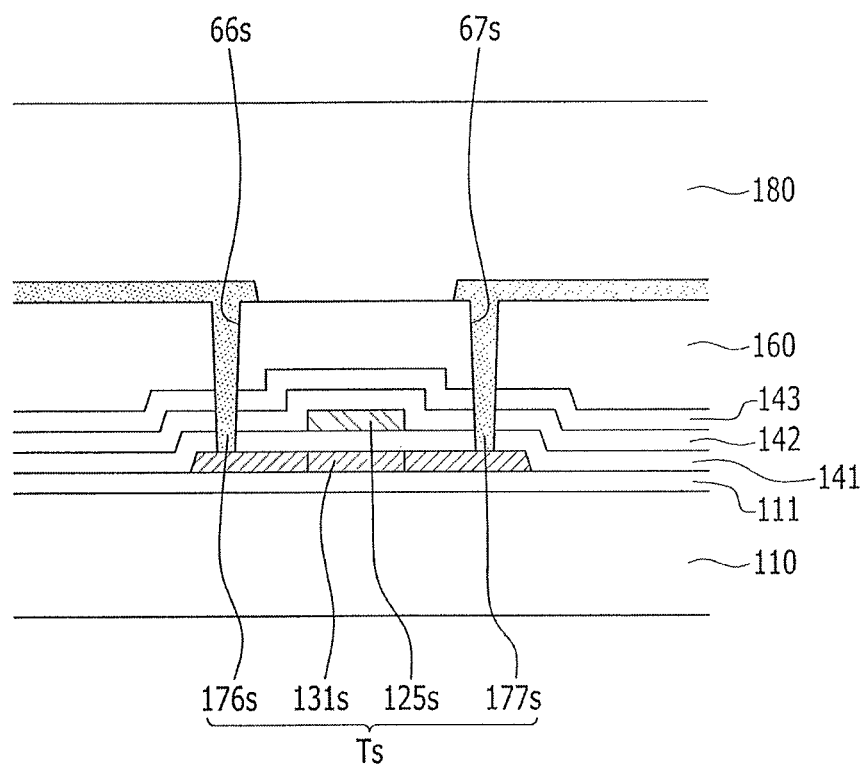
FIG. 8 is a cross-sectional view taken along line VIII-VIII of FIG. 5.

FIG. 3 is a view schematically illustrating a plurality of transistors and capacitors of the pixel portion of the organic light emitting diode display according to the exemplary embodiment, FIG. 4 is a specific layout view of one pixel of FIG. 3, FIG. 5 is a view schematically illustrating a transistor of a peripheral portion of the organic light emitting diode display according to the exemplary embodiment, FIG. 6 is a cross-sectional view of the organic light emitting diode display of FIG. 4, which is taken along line VI-VI, FIG. 7 is a cross-sectional view of the organic light emitting diode display of FIG. 4, which is taken along line VII-VII, and FIG. 8 is a cross-sectional view taken along line VIII-VIII of FIG. 5.

As illustrated in FIG. 3, the pixel of the pixel portion P of the organic light emitting diode display according to the exemplary embodiment includes the scan line 121, the prior scan line 122, the light emission control line 123, and the initialization voltage line 124 applying the scan signal Sn, the prior scan signal Sn−1, the light emission control signal En, and the initialization voltage Vint, respectively, and formed in a row direction, and the data line 171 and the driving voltage line 172 crossing all the scan line 121, the prior scan line 122, the light emission control line 123, and the initialization voltage line 124 and applying the data signal Dm and the driving voltage ELVDD, respectively, to the pixel.

Further, the driving transistor T1, the pixel switching transistor T2, the compensation transistor T3, the initialization transistor T4, the operation control transistor T5, the light emission control transistor T6, the storage capacitor Cst, and the organic light emitting diode (OLED) are formed in the pixel.

As illustrated in FIGS. 3 and 4, the driving transistor T1, the pixel switching transistor T2, the compensation transistor T3, the initialization transistor T4, the operation control transistor T5, and the light emission control transistor T6 formed in the pixel portion P are formed along the semiconductor layer 131, and the semiconductor layer 131 is formed to be bent in various shapes. The semiconductor layer 131 may be formed of, e.g., polysilicon or oxide semiconductor. The oxide semiconductor may include, e.g., any one of oxides of zinc (Zn), gallium (Ga), tin (Sn), or indium (In) as a basis, or zinc oxide (ZnO), indium-gallium-zinc oxide (InGaZnO$_4$), indium-zinc oxide (Zn—In—O), or zinc-tin oxide (Zn—Sn—O) that are complex oxides thereof. In the case where the semiconductor layer 131 is formed of the oxide semiconductor, a separate protective layer may be added to protect the oxide semiconductor that is weak to an external environment such as high temperatures.

The semiconductor layer 131 includes a channel region not doped with an impurity and a source region and a drain region formed at both sides of the channel region to be doped with the impurity. Herein, the impurity is changed according to a kind of transistor, and an N type impurity or a P type impurity is feasible.

The semiconductor layer 131 includes a driving semiconductor layer 131a formed in the driving transistor T1, a pixel switching semiconductor layer 131b formed in the pixel switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

Further, the semiconductor layer 131 includes a peripheral switching semiconductor layer 131s formed in a peripheral switching transistor Ts of the peripheral portion S.

The driving transistor T1 includes the driving semiconductor layer 131a, the driving gate electrode 125a, the driving source electrode 176a, and the driving drain electrode 177a. The driving semiconductor layer 131a is bent. The driving semiconductor layer 131a includes a plurality of first extension portions 31 extending in a first direction, a plurality of second extension portions 32 extending in a second direction that is different from the first direction, and a plurality of bent portions 33 connecting the first extension portion 31 and the second extension portion 32. Accordingly, the driving semiconductor layer 131a may be disposed in a zigzag form. The driving semiconductor layer 131a illustrated in FIGS. 3 and 4 includes three first extension portions 31, two second extension portions 32, and four bent portions 33. The driving semiconductor layer 131a may be longitudinally disposed in a '⇌' form, e.g., in a zigzag form.

As described above, the driving semiconductor layer 131a may be longitudinally fainted in a narrow space by forming the driving semiconductor layer 131a including a plurality of bent portions 33. Accordingly, since the driving channel region 131a1 of the driving semiconductor layer 131a may be longitudinally formed, the driving range of the gate voltage applied to the driving gate electrode 125a is broadened. Therefore, since the driving range of the gate voltage is broad, a grayscale of light emitted from an organic light emitting diode (OLED) can be more finely controlled by changing the magnitude of the gate voltage. Accordingly, it is possible to increase a resolution of the organic light emitting diode display and improve a display quality.

In the driving semiconductor layer 131a, the first extension portion 31, the second extension portion 32, and the bent portion 33 may be variously disposed to implement various exemplary embodiments such as the shapes of 'S', 'M', and 'W'.

The driving source electrode 176a corresponds to the driving source region 176a doped with the impurity in the driving semiconductor layer 131a, and the driving drain electrode 177a corresponds to the driving drain region 177a doped with the impurity in the driving semiconductor layer 131a. The storage capacitor Cst is formed on the driving gate electrode 125a while overlapping the driving gate electrode 125a on a cross section.

The storage capacitor Cst includes a first storage capacitive plate 125a and a second storage capacitive plate 127 disposed with a third gate insulating layer 143 interposed therebetween. Herein, the driving gate electrode 125a plays a role of the first storage capacitive plate 125a, the third gate insulating layer 143 becomes a dielectric material, and a storage capacitance is determined by the charge accumulated in the storage capacitor Cst and the voltage between both capacitive plates 125a and 127.

The first storage capacitive plate 125a is separated from the adjacent pixel to form, e.g., a rectangular shape. The first storage capacitive plate 125a is formed of the same material as the scan line 121, the prior scan line 122, the light emission control line 123, the switching gate electrode 125b, the compensation gate electrode 125c, the operation control gate electrode 125e, and the light emission control gate electrode 125f, on the same layer.

The second storage capacitive plate 127 is connected to the adjacent pixel, and is formed of the same material as the initialization voltage line 124 on the same layer thereas.

As described above, it is possible to ensure the storage capacitance, even at a high resolution, by forming the storage capacitor overlapping the driving semiconductor layer 131a in order to ensure a region of the storage capacitor reduced by the driving semiconductor layer 131a has the bent portion.

The pixel switching transistor T2 includes the pixel switching semiconductor layer 131b, the pixel switching gate electrode 125b, a pixel switching source electrode 176b, and a pixel switching drain electrode 177b. The switching source electrode 176b is a portion protruding from the data line 171, and the switching drain electrode 177b corresponds to a switching drain region 177b doped with an impurity in the pixel switching semiconductor layer 131b.

The compensation transistor T3 includes the compensation semiconductor layer 131c, the compensation gate electrode 125c, a compensation source electrode 176c, and a compensation drain electrode 177c, the compensation source electrode 176c corresponds to a compensation source region 176c doped with the impurity in the compensation semiconductor layer 131c, and the compensation drain electrode 177c corresponds to a compensation drain region 177c doped with the impurity in the compensation semiconductor layer 131c. The compensation gate electrode 125c may reduce the possibility of and/or prevent a leakage current by forming a separate dual gate electrode 25.

The initialization transistor T4 includes the initialization semiconductor layer 131d, an initialization gate electrode 125d, an initialization source electrode 176d, and an initialization drain electrode 177d. The initialization drain electrode 177d corresponds to an initialization drain region 177d doped with the impurity in the initialization semiconductor layer 131d. The initialization source electrode 176d is connected through an initialization connection line 78 to the initialization voltage line 124. An end of the initialization connection line 78 is connected through a contact hole 161 formed in the third gate insulating layer 143 and an interlayer insulating layer 160 to the initialization voltage line 124. Another end of the initialization connection line 78 is connected through a contact hole 162 formed in the first gate insulating layer 141, the second gate insulating layer 142, the third gate insulating layer 143, and the interlayer insulating layer 160 to the initialization source electrode 176d.

The operation control transistor T5 includes an operation control semiconductor layer 131e, an operation control gate electrode 125e, an operation control source electrode 176e, and an operation control drain electrode 177e. The operation control source electrode 176e is a portion of the driving voltage line 172, and the operation control drain electrode 177e corresponds to the operation control drain region 177e doped with the impurity in the operation control semiconductor layer 131e.

The light emission control transistor T6 includes the light emission control semiconductor layer 131f, the light emission control gate electrode 125f, a light emission control source electrode 176f, and a light emission control drain electrode 177f. The light emission control source electrode 176f corresponds to a light emission control source region 178f doped with the impurity in the light emission control semiconductor layer 131f.

An end of the driving semiconductor layer 131a of the driving transistor T1 is connected to the switching semiconductor layer 131b and the compensation semiconductor layer 131c, and another end of the driving semiconductor layer 131a is connected to the operation control semiconductor layer 131e and the light emission control semiconductor layer 131f. Therefore, the driving source electrode 176a is connected to the switching drain electrode 177b and the operation control drain electrode 177e. The driving drain electrode 177a is connected to the compensation source electrode 176c and the light emission control source electrode 176f.

The first storage capacitive plate 125a of the storage capacitor Cst is connected through the connection member 174 to the compensation drain electrode 177c and the initialization drain electrode 177d together. The connection member 174 is formed on the same layer as the data line 171, an end of the connection member 174 is connected through a contact hole 166 formed in the first gate insulating layer 141, the second gate insulating layer 142, the third gate insulating layer 143, and the interlayer insulating layer 160 to the compensation drain electrode 177c and the initialization drain electrode 177d. Another end of the connection member 174 is connected through a contact hole 167 formed in the second gate insulating layer 143 and the interlayer insulating layer 160 to the first storage capacitive plate 125a. In this case, another end of the connection member 174 is connected through a storage opening 27 formed in the second storage capacitive plate 127 to the first storage capacitive plate 125a.

The second storage capacitive plate 127 of the storage capacitor Cst is connected through a contact hole 168 formed in the interlayer insulating layer 160 to the driving voltage line 172.

The pixel switching transistor T2 is used as a switching diode selecting the pixel that is to emit light. The switching gate electrode 125b is connected to the scan line 121, the switching source electrode 176b is connected to the data line 171, and the switching drain electrode 177b is connected to the driving transistor T1 and the operation control transistor T5. The light emission control drain electrode 177f of the light emission control transistor T6 is connected, e.g., directly connected, through a contact hole 181 formed in a protective layer 180 to a pixel electrode 191 of an organic light emitting diode 70.

Referring to FIG. 5, the peripheral switching transistor Ts includes the peripheral switching semiconductor layer 131s, the peripheral switching gate electrode 125s, a peripheral switching source electrode 176s, and a peripheral switching drain electrode 177s. The peripheral switching source electrode 176s and the peripheral switching drain electrode 177s face each other based on the flat surface type peripheral switching gate electrode 125s. The peripheral switching transistor Ts is used as a switching diode switching a peripheral circuit 2 such as a driver positioned on the peripheral portion S.

Hereinafter, a structure of the pixel portion and the peripheral portion of the organic light emitting diode display, according to the exemplary embodiment, will be specifically described according to the lamination order with reference to referring to FIGS. 4 to 8.

The structure of the transistor will be described based on the driving transistor T1, the pixel switching transistor T2, and the light emission control transistor T6 of the pixel portion P, and the peripheral switching transistor Ts of the peripheral portion S as a key constitution. The remaining transistors T3, T4, and T5 may each be substantially the same as one of the laminate structures of the driving transistor T1, the pixel switching transistor T2, and the light emission control transistor T6, and thus are not described in further detail.

A buffer layer 111 is formed on the substrate 110, and the substrate 110 is formed of an insulating substrate, e.g., made of glass, quartz, ceramics, plastics, or the like.

The driving semiconductor layer 131a, the pixel switching semiconductor layer 131b, and the light emission control semiconductor layer 131f are formed on the buffer layer 111 of the pixel portion P. The driving semiconductor layer 131a includes a driving channel region 131a1 and the driving source region 176a and the driving drain region 177a facing each other with the driving channel region 131a1 interposed therebetween. The pixel switching semiconductor layer 131b includes a pixel switching channel region 131b1 and a pixel switching source region 132b and a pixel switching drain region 177b facing each other with the pixel switching channel region 131b1 interposed therebetween. The light emission control transistor T6 includes a light emission control channel region 131f1, the light emission control source region 176f, and the light emission control drain region 133f.

Since the driving semiconductor layer 131a includes a plurality of bent portions 33 to be formed in a zigzag form, specifically, in a '⇌' form, the driving semiconductor layer 131a may be longitudinally formed in a narrow space. Accordingly, since the driving channel region 131 a1 of the driving semiconductor layer 131a may be longitudinally formed, the driving range of the gate voltage applied to the driving gate electrode 125a is broadened.

Further, the peripheral switching semiconductor layer 131s is formed on the buffer layer 111 of the peripheral portion S.

The first gate insulating layer 141 and the second gate insulating layer 142 formed of, e.g., silicon nitride ($SiN_x$), silicon oxide ($SiO_2$) or the like, are sequentially formed on the pixel switching semiconductor layer 131a, the driving semiconductor layer 131b, and the light emission control semiconductor layer 131f of the pixel portion P. Only the first gate insulating layer 141 is formed on the peripheral switching semiconductor layer 131s of the peripheral portion S, e.g., such that the second gate insulating layer 142 is formed on the peripheral switching gate electrode 125s in the peripheral portion S.

A first gate wire including the peripheral switching gate electrode 125s is formed at a position overlapping the peripheral switching semiconductor layer 131s on the first gate insulating layer 141 of the peripheral portion S, and the second gate insulating layer 142 is formed on the peripheral switching gate electrode 125s. In addition, second gate wires including the scan line 121 including the driving gate electrode 125a, the pixel switching gate electrode 125b, and the compensation gate electrode 125c, the prior scan line 122 including the initialization gate electrode 125d, and the light emission control line 123 including the operation control gate electrode 125e and the light emission control gate electrode 125f are formed on the second gate insulating layer 142 of the pixel portion P.

The driving gate electrode 125a is separated from the scan line 121, and the floating gate electrode 25 overlaps the driving channel region 131a1 of the driving semiconductor layer 131a. In addition, the pixel switching gate electrode 125a is connected to the scan line 121, and the pixel switching gate electrode 125b overlaps the pixel switching channel region 131b1 of the pixel switching semiconductor layer 131b. In addition, the light emission control gate electrode 125f overlaps the light emission control channel region 131f1 of the light emission control semiconductor layer 131f.

For example, since only the first gate insulating layer 141 is formed between the peripheral switching gate electrode 125b and the peripheral switching semiconductor layer 131b, the peripheral switching transistor Ts can perform rapid switching operation. Further, in the pixel switching transistor T2 and the driving transistor T1, since the first gate insulating layer 141 and the second gate insulating layer 142 are formed between the pixel switching gate electrode 125b and the pixel switching semiconductor layer 131b and between the driving gate electrode 125a and the driving semiconductor layer 131a, a distance between the pixel switching gate electrode 125b and the pixel switching semiconductor layer 131b is increased, and a distance between the driving gate electrode 125a and the driving semiconductor layer 131a is increased. Accordingly, the driving range of the gate voltage applied to the driving gate electrode 125a is broadened.

Further, in the driving transistor T1, since the length of the driving channel region 131 a1 of the driving semiconductor layer 131a is large, the driving range of the gate voltage applied to the driving gate electrode 125a may be further broadened to more finely control the grayscale of light emitted from the organic light emitting diode (OLED).

The third gate insulating layer 143 is formed of silicon nitride ($SiN_x$), silicon oxide ($SiO_2$), or the like on the second gate wires 125a, 125b, 125c, 125d, 125e, 125f, 121, 122, and 123 and the second gate insulating layer 142 of the pixel portion P and the second gate insulating layer 142 of the peripheral portion S.

Third gate wires including the second storage capacitive plate 127 and the initialization voltage line 124 are formed on the third gate insulating layer 143 of the pixel portion P. The second storage capacitive plate 127 overlaps the first storage capacitive plate 125a to form the storage capacitor Cst, and the first storage capacitive plate 125a overlaps the driving semiconductor layer 131a. As described above, it is possible to ensure a storage capacitance even at a high resolution at which the size of the pixel is reduced by ensuring a region of the storage capacitor Cst reduced by the driving semiconductor layer 131a having the bent portion 33 by forming the storage capacitor Cst overlapping the driving semiconductor layer 131a.

The interlayer insulating layer 160 is formed on the third gate insulating layer 143, the second storage capacitive plate 127, and the initialization voltage line 124. The first gate insulating layer 141, the second gate insulating layer 142, the third gate insulating layer 143, and the interlayer insulating layer 160 have a contact hole 163 through which the light emission control drain region 131f1 of the light emission control semiconductor layer 131f is exposed together. Like the first gate insulating layer 141, the second gate insulating layer 142, and the third gate insulating layer 143, the interlayer insulating layer 160 is made of a ceramic-based material such as silicon nitride ($SiN_x$) or silicon oxide ($SiO_2$).

Data wires including the data line 171 including the pixel switching source electrode 176b, the driving voltage line 172, the connection member 174, and the light emission control drain electrode 177f are formed on the interlayer insulating layer 160 of the pixel portion P, and the peripheral switching source electrode 176s and the peripheral switching drain electrode 177s are formed on the interlayer insulating layer 160 of the peripheral portion S.

In addition, the pixel switching source electrode 176b and the light emission control drain electrode 177f are respectively connected through contact holes 164 and 163 formed in the interlayer insulating layer 160, the first gate insulating layer 141, the second gate insulating layer 142, and the third gate insulating layer 143 to the pixel switching source region 131b1 of the pixel switching semiconductor layer 131b and the light emission control drain region 131f1 of the light emission control semiconductor layer 131f, and the peripheral switching source electrode 176s and the peripheral switching drain electrode 177s are each connected through contact holes 66s and 67s formed in the interlayer insulating layer 160, the first gate insulating layer 141, the second gate insulating layer 142, and the third gate insulating layer 143 to the peripheral switching semiconductor layer 131s.

The protective layer 180 covering the data wires 171, 172, 174, and 177f, the peripheral switching source electrode 176s, and the peripheral switching drain electrode 177s is formed on the interlayer insulating layer 160. The pixel electrode 191 is formed on the protective layer 180 of the pixel portion P, and the pixel electrode 191 is connected through the contact hole 181 formed in the protective layer 180 to the light emission control drain electrode 177f.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of resins such as polyacrylates and polyimides or silica-based inorganic materials.

An organic emission layer 370 is formed on the pixel electrode 191 exposed through the barrier rib opening 351, and the common electrode 270 is formed on the organic emission layer 370. As described above, the organic light emitting diode 70 including the pixel electrode 191, the organic emission layer 370, and the common electrode 270 is formed.

Herein, the pixel electrode 191 is an anode that is a hole injection electrode, and the common electrode 270 is a cathode that is an electron injection electrode. However, the embodiments are not limited thereto, e.g., the pixel electrode 191 may be the cathode and the common electrode 270 may be the anode according to the driving method of the organic light emitting diode display. Holes and electrons are injected from the pixel electrode 191 and the common electrode 270 into the organic emission layer 370, and when an exciton that is bonded to the injected holes and electrons falls from an exited state to a bottom state, light is emitted.

The organic emission layer 370 is formed of a low molecular weight organic material or a high molecular weight organic material such as PEDOT (poly 3,4-ethylenedioxythiophene). Further, the organic emission layer 370 may be formed of a multilayer including one or more of an emission layer, a hole injection layer HIL, a hole transport layer HTL, an electron transport layer ETL, and an electron injection layer EIL. In the case where all the layers are included, the hole injection layer HIL is disposed on the pixel electrode 710 that is the anode, and the hole transport layer HTL, the emission layer, the electron transport layer ETL, and the electron injection layer EIL are sequentially laminated thereon.

The organic emission layer 370 may include a red organic emission layer emitting light having a red color, a green organic emission layer emitting light having a green color, and a blue organic emission layer emitting light having a blue color, and the red organic emission layer, the green organic emission layer, and the blue organic emission layer are respectively formed in a red pixel, a green pixel, and a blue pixel to implement a color image.

Further, the organic emission layer 370 may implement the color image by laminating all the red organic emission layer, the green organic emission layer, and the blue organic emission layer in the red pixel, the green pixel, and the blue pixel together, and forming a red color filter, a green color filter, and a blue color filter for each pixel. As another example, a white organic emission layer emitting light having a white color may be formed in all of the red pixel, the green pixel, and the blue pixel, and the red color filter, the green color filter, and the blue color filter may be formed for each pixel to implement the color image. In the case where the color image is implemented by using the white organic emission layer and the color filter, a deposition mask for forming the red organic emission layer, the green organic emission layer, and the blue organic emission layer does not need to be used, which is advantageous to improve the resolution.

When the common electrode 270 is formed of a reflective conductive material, a rear surface light emission type organic light emitting diode display is obtained. Material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

Hereinafter, a method of manufacturing the organic light emitting diode display according to the exemplary embodiment will be described in detail with reference the drawings.

Figure 9:
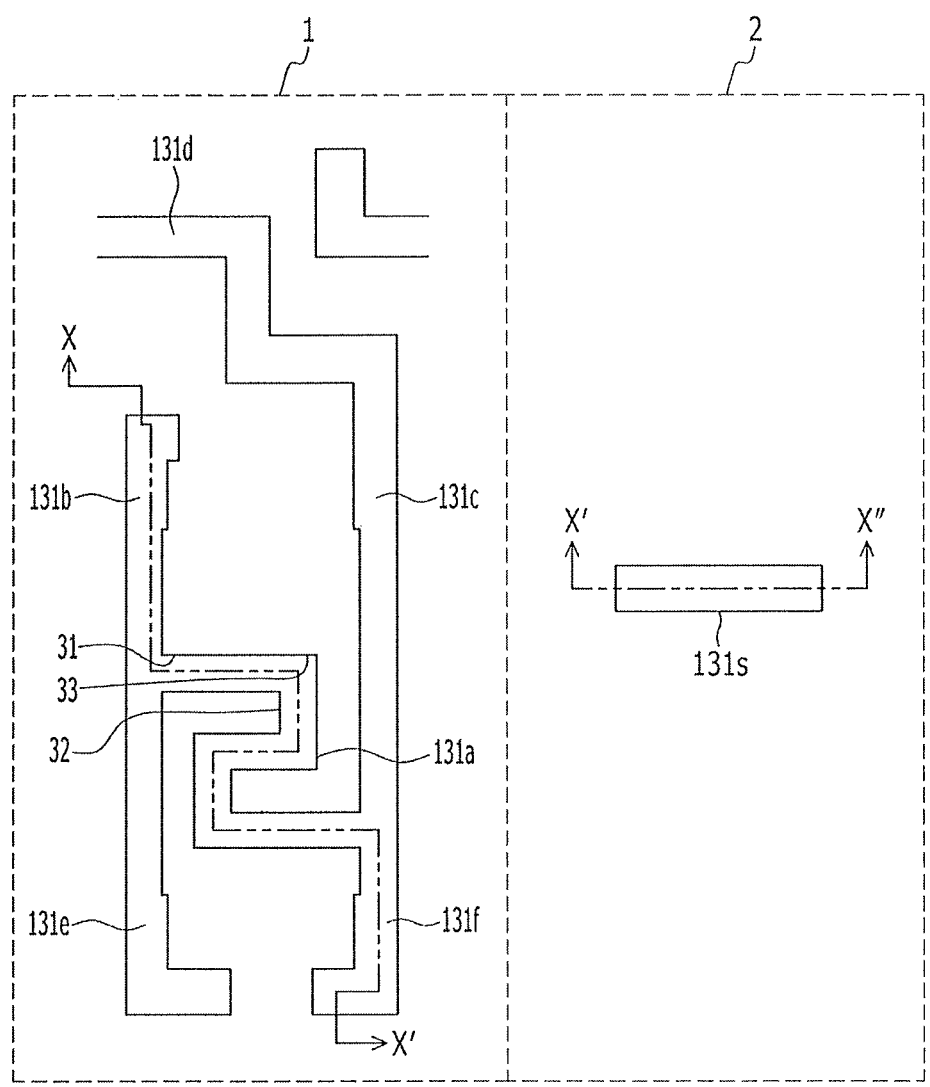
FIGS. 9, 11, and 13 are layout views sequentially illustrating a method of manufacturing the organic light emitting diode display according to the exemplary embodiment.
Figure 10:
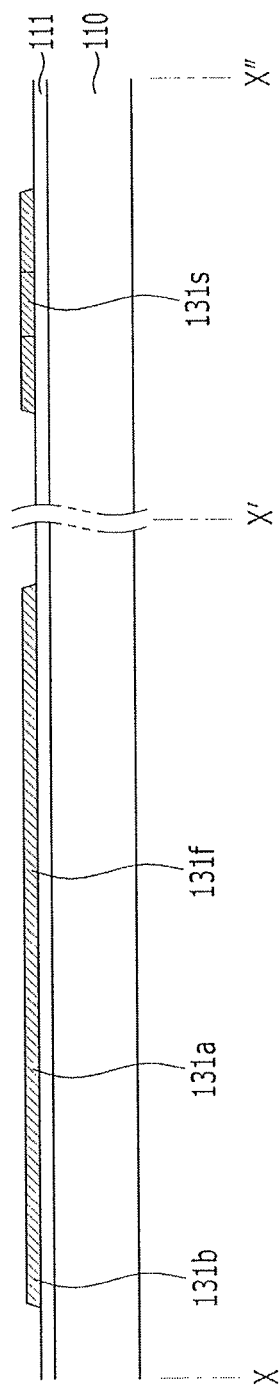
FIG. 10 is a cross-sectional view of the organic light emitting diode display of FIG. 9, which is taken along lines X-X' and X'-X".
Figure 11:
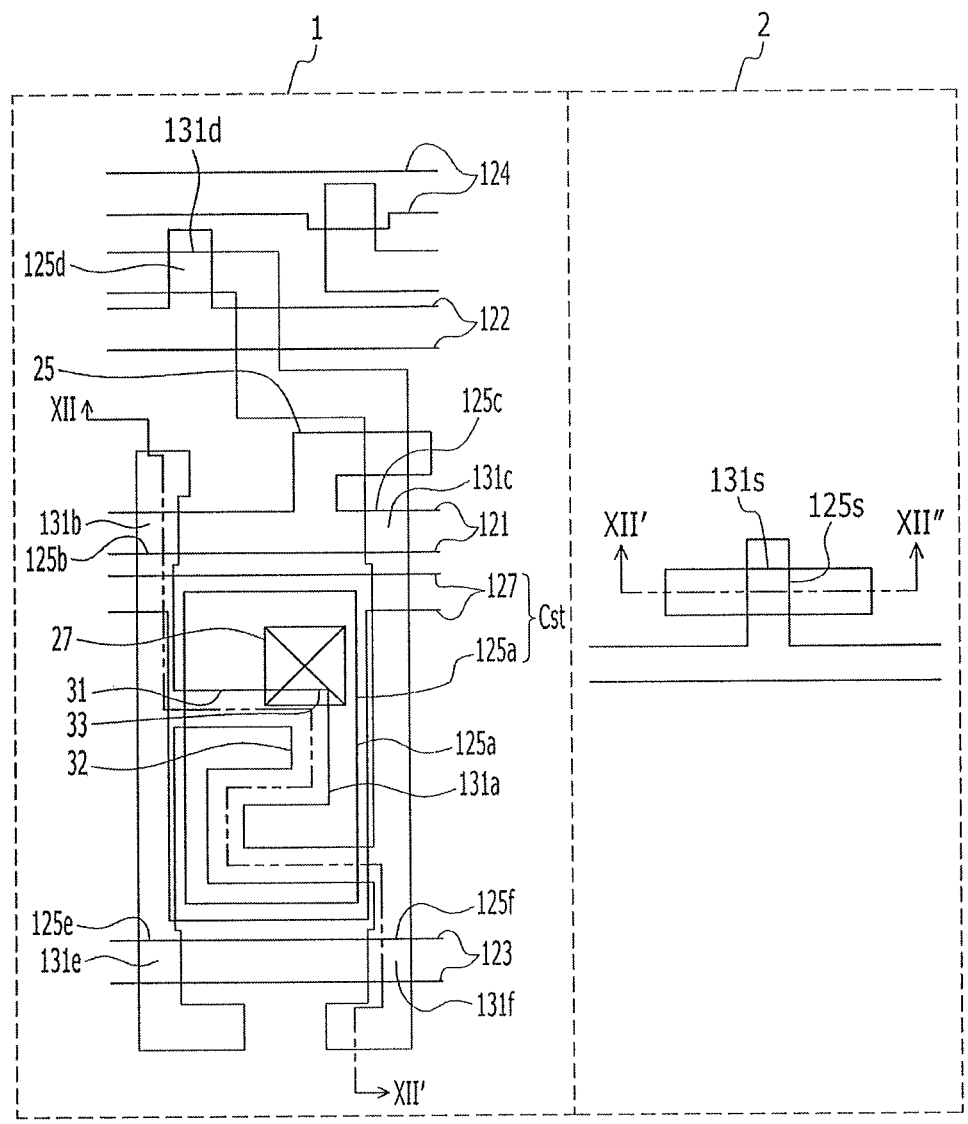
Figure 12:
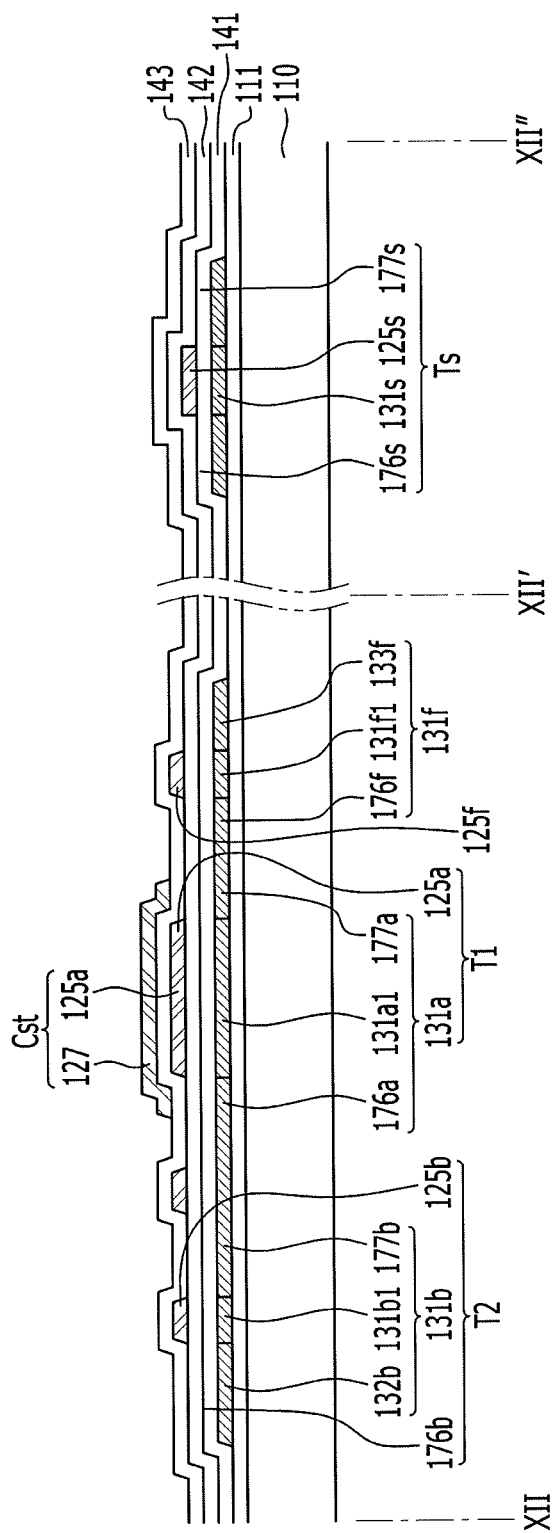
FIG. 12 is a cross-sectional view of the organic light emitting diode display of FIG. 11, which is taken along lines XII-XII' and XII'-XII".
Figure 13:
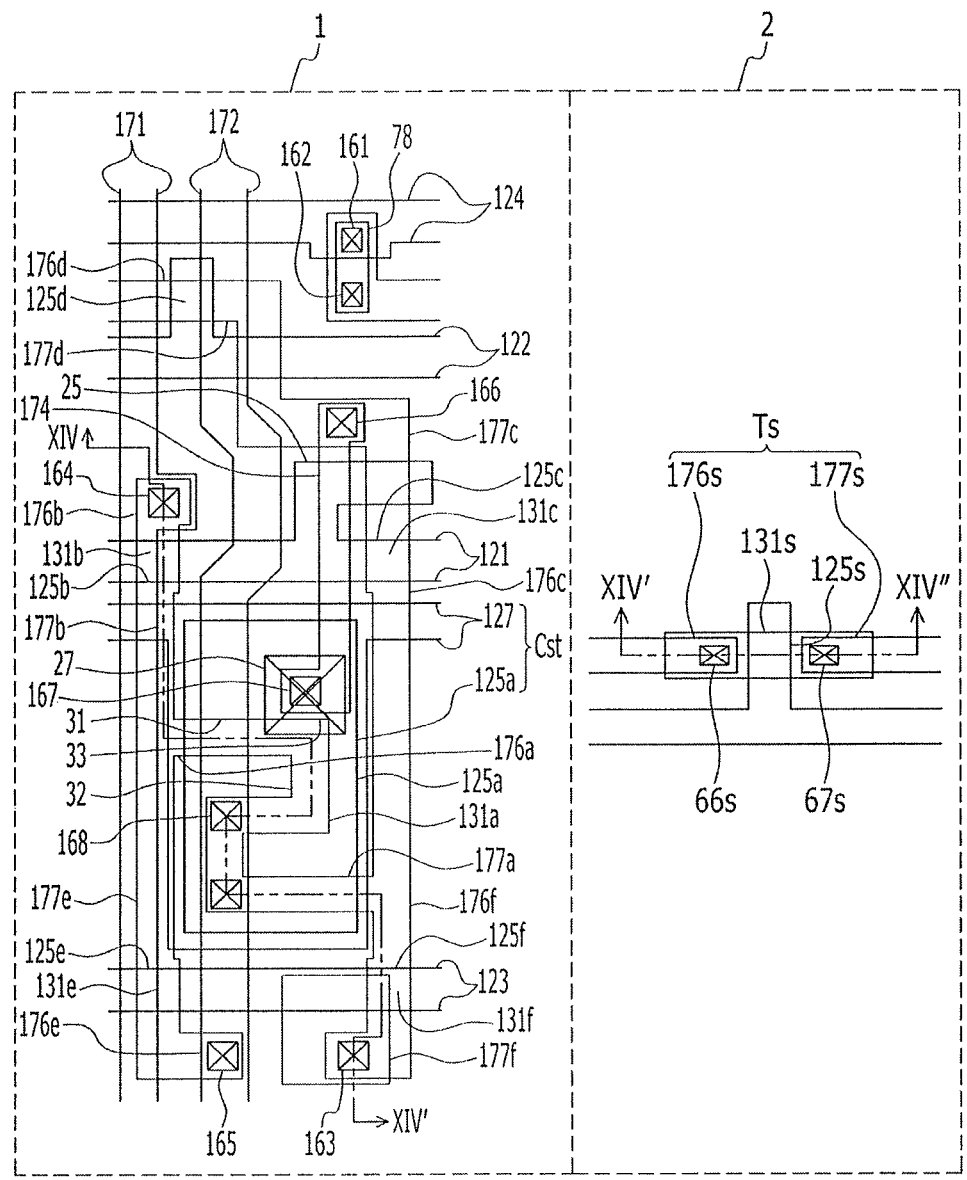
Figure 14:
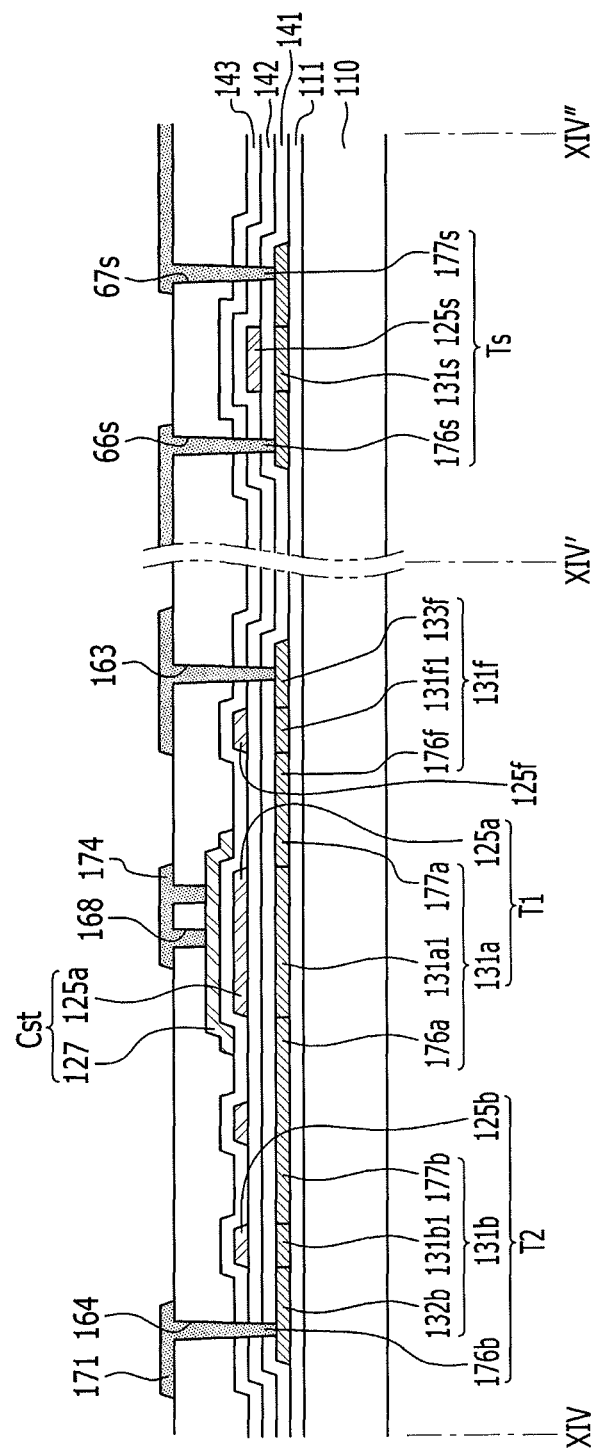
FIG. 14 is a cross-sectional view of the organic light emitting diode display of FIG. 13, which is taken along lines XIV-XIV' and XIV'-XIV".

FIGS. 9, 11, and 13 are layout views sequentially illustrating a method of manufacturing the organic light emitting diode display according to the exemplary embodiment, FIG. 10 is a cross-sectional view of the organic light emitting diode display of FIG. 9, which is taken along lines X-X' and X'-X", FIG. 12 is a cross-sectional view of the organic light emitting diode display of FIG. 11, which is taken along lines XII-XII' and XII'-XII", and FIG. 14 is a cross-sectional view of the organic light emitting diode display of FIG. 13, which is taken along lines XIV-XIV' and XIV'-XIV".

First, as illustrated in FIGS. 9 and 10, the buffer layer 111 is formed on all of the peripheral portion S and the pixel portion P of the substrate 110. The substrate 110 may be formed of a transparent insulating substrate such as glass, quartz, or plastics. The buffer layer 111 may be foamed of a single layer of silicon nitride or a laminate layer of silicon nitride and silicon oxide, and is deposited on an entire surface of the substrate 10 by a method such as plasma chemical vapor deposition (PECVD).

A semiconductor layer 131 is formed on the buffer layer 111 of the pixel portion P. The semiconductor layer 131 may be formed of polysilicon or an oxide semiconductor, and the polysilicon may be formed by a method of forming an amorphous silicon layer and then crystallizing the layer. Various known methods may be applied as the crystallizing method, and for example, the amorphous silicon layer may be crystallized by using heat, a laser, Joule heat, an electric field, a catalyst metal, or the like. The semiconductor layer 131 is patterned by a photolithography process using a first mask. Thereby, the driving semiconductor layer 131a, the pixel switching semiconductor layer 131b, the compensation semiconductor layer 131c, the initialization semiconductor layer 131d, the operation control semiconductor layer 131e, the light emission control semiconductor layer 131f, and the peripheral switching semiconductor layer 131s are simultaneously formed.

Next, as illustrated in FIGS. 11 and 12, a first gate insulating layer 141 is formed on the driving semiconductor layer 131a, the pixel switching semiconductor layer 131b, the compensation semiconductor layer 131c, the initialization semiconductor layer 131d, the operation control semiconductor layer 131e, and the light emission control semiconductor layer 131f of the pixel portion P, and the peripheral switching semiconductor layer 131s of the peripheral portion S. The first gate insulating layer 141 may be formed of silicon nitride ($SiN_x$), silicon oxide ($SiO_2$), or the like, and is deposited on an entire surface of the buffer layer 111 by a method such as plasma chemical vapor deposition (PECVD).

The first gate metal layer is formed on the first gate insulating layer 141. The first gate metal layer may be formed of a multilayer where a metal layer including, e.g., any one of copper (Cu), a copper alloy, aluminum (Al), and an aluminum alloy, and a metal layer including any one of molybdenum (Mo) and a molybdenum alloy are laminated. In addition, the first gate metal layer is patterned by a photolithography process using a second mask. Thereby, the peripheral switching gate electrode 125s is formed at a position overlapping the peripheral switching semiconductor layer 131s in the peripheral portion S. The peripheral switching semiconductor layer 131s is classified into a channel region, a source region, and a drain region by doping the peripheral switching semiconductor layer 131s with the impurity. The peripheral switching gate electrode 125s may reduce the possibility of and/or prevent the channel region from being doped with the impurity when the source region and the drain region are doped with the impurity.

The second gate insulating layer 142 is formed on the first gate insulating layer 141 and the peripheral switching gate electrode 125s. The second gate wires 125a, 125b, 125c, 125d, 125e, 125f, 121, 122, and 123 are formed on the pixel portion P by forming the second gate metal layer on the second gate insulating layer 142 and patterning the second gate metal layer by a photolithography process using a third mask. The second gate metal layer may be formed of a multilayer, e.g., where a metal layer including any one of copper (Cu), a copper alloy, aluminum (Al), and an aluminum alloy, and a metal layer including any one of molybdenum (Mo) and a molybdenum alloy are laminated.

The driving semiconductor layer 131a, the pixel switching semiconductor layer 131b, the compensation semiconductor layer 131c, the initialization semiconductor layer 131d, the operation control semiconductor layer 131e, and the light emission control semiconductor layer 131f of the pixel portion P are each classified into the channel region, the source region, and the drain region by doping the driving semiconductor layer 131a, the pixel switching semiconductor layer 131b, the compensation semiconductor layer 131c, the initialization semiconductor layer 131d, the operation control semiconductor layer 131e, and the light emission control semiconductor layer 131f of the pixel portion P with the impurity.

The third gate insulating layer 143 is formed on the second gate wires 125a, 125b, 125c, 125d, 125e, 125f, 121, 122, and 123 and the second gate insulating layer 142 of the pixel portion P and the second gate insulating layer 142 of the peripheral portion S. In addition, third gate wires including the second storage capacitive plate 127 and the initialization voltage line 124 are formed on the pixel portion P by forming the third gate metal layer on the third gate insulating layer 143 of the pixel portion P and patterning the third gate metal layer by a photolithography process using a fourth mask. For example, a storage opening 27 is formed in the second storage capacitive plate 127. The third gate metal layer may be formed of a multilayer where a metal layer including any one of copper (Cu), a copper alloy, aluminum (Al), and an aluminum alloy, and a metal layer including any one of molybdenum (Mo) and a molybdenum alloy are laminated.

Next, as illustrated in FIGS. 13 and 14, the interlayer insulating layer 160 is formed on the third gate insulating layer 143, the second storage capacitive plate 127, and the initialization voltage line 124. The interlayer insulating layer 160 is formed of an organic layer or an inorganic layer, and deposited on an entire surface of the substrate 110. In addition, the interlayer insulating layer 160, the first gate insulating layer 141, and the second gate insulating layer 142, and the third gate insulating layer 143 are patterned by a photolithography process using a fifth mask to form a plurality of contact holes 161, 162, 163, 164, 165, 166, 167, 168, 66s, and 67s.

A data metal layer is formed on the interlayer insulating layer 160. The data metal layer may be formed of a multilayer where a metal layer including, e.g., any one of copper, a copper alloy, aluminum, and an aluminum alloy, and a metal layer including any one of molybdenum and a molybdenum alloy are laminated. For example, the data metal layer may be formed of a Mo/Al/Mo triple layer or a Mo/Cu/Mo triple layer.

In addition, the data metal layer is patterned by a photolithography process using a sixth mask. Thereby, the data wires including the data line 171 including the pixel switching source electrode 176b, the driving voltage line 172, the connection member 174, and the light emission control drain electrode 177f are formed on the interlayer insulating layer 160 of the pixel portion P, and the peripheral switching source electrode 176s and the peripheral switching drain electrode 177s are formed on the interlayer insulating layer 160 of the peripheral portion S.

Next, as illustrated in FIGS. 4 to 8, the protective layer 180 covering the data wires 171, 172, 174, and 177f, the peripheral switching source electrode 176s, and the peripheral switching drain electrode 177s is formed on the interlayer insulating layer 160, and a contact hole 181 is formed in the protective layer 180 by a photolithography process using a seventh mask. In addition, the pixel electrode layer is formed on the protective layer 180 of the pixel portion P, and patterned by a photolithography process using a eighth mask to form the pixel electrode 191 connected through the contact hole 181 to the light emission control drain electrode 177f. The barrier rib 350 covering the pixel electrode 191 is formed on the protective layer 180, and the barrier rib opening 351 through which a portion of the pixel electrode 191 is exposed is formed in the barrier rib 350 by using a ninth mask.

In addition, the organic emission layer 370 is formed on the pixel electrode 191 exposed through the barrier rib opening 351 of the barrier rib 350. The organic light emitting diode 70 may be completed by forming the common electrode 270 on the organic emission layer 370. The common electrode 270 is formed even on the barrier rib 350 to be formed over a plurality of pixels.

A sealing member (not illustrated) for protecting the organic light emitting diode 70 may be formed on the common electrode 270, may be sealed by a sealant on the substrate 110, and may be formed of various materials such as glass, quartz, ceramic, plastics, and metal. A sealing thin film layer may be formed by depositing, e.g., an inorganic layer and an organic layer on the common electrode 270 while not using the sealant.

By way of summation and review, an organic light emitting diode display includes a pixel portion including a plurality of pixels on which an organic light emitting diode, which is a self-light emitting diode, is formed. The organic light emitting diode display also includes a peripheral portion surrounding the pixel portion. A plurality of transistors and capacitors for driving the organic light emitting diode are formed on each pixel of the pixel portion, and another plurality of transistors and capacitors forming a driver are formed on the peripheral portion. The plurality of transistors of the pixel portion include a switching transistor and a driving transistor, and the plurality of transistors of the peripheral portion include the switching transistor.

The higher the resolution of the organic light emitting diode display is, the lower a quantity of current per pixel is. Accordingly, a driving range of a gate voltage applied to a gate electrode of the switching transistor and the driving transistor of the pixel portion becomes narrow which easily generates stains.

The described technology relates to an organic light emitting diode display and a method of manufacturing the same. For example, the described technology has been made in an effort to provide an organic light emitting diode display having a broadened driving range of a pixel switching transistor and a driving transistor of a pixel portion to display various grayscales and having improved charge mobility of a peripheral switching transistor of the peripheral portion. Further, embodiments relate to broadening a driving range of a pixel switching transistor and to a driving transistor of a pixel portion displaying various grayscales and to forming the first gate insulating layer and a second gate insulating layer between the gate electrode and the semiconductor layer of the pixel switching transistor and the driving transistor of the pixel portion. Embodiments also relate to improving charge mobility of a peripheral switching transistor of a peripheral portion and to forming only a first gate insulating layer between a gate electrode and a semiconductor layer of the peripheral switching transistor of the peripheral portion.

Also, according to embodiments, it is possible to sufficiently ensure storage capacitance even at a high resolution by forming a storage capacitor overlapping the driving semiconductor layer in order to ensure a region of the storage capacitor reduced by the driving semiconductor layer having a bent portion. Further, in the driving transistor of the pixel portion, since a driving channel region of a driving semiconductor layer may be longitudinally formed, e.g., by forming the driving semiconductor layer including a plurality of bent portions, a driving range of a gate voltage applied to a driving gate electrode may be broadened.

Accordingly, since the driving range of the gate voltage is broad, a grayscale of light emitted from an organic light emitting diode (OLED) can be more finely controlled by changing the magnitude of the gate voltage. Accordingly, it is possible to increase a resolution of the organic light emitting diode display and improve quality of the display.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate including a pixel portion displaying an image and a peripheral portion surrounding the pixel portion;
   a semiconductor layer including a pixel switching semiconductor layer on the pixel portion on the substrate, a driving semiconductor layer, and a peripheral switching semiconductor layer on the peripheral portion, the driving semiconductor layer being bent;
   a first insulating layer on the semiconductor layer;
   a peripheral switching gate electrode on the first insulating layer of the peripheral portion;
   a second insulating layer covering the peripheral switching gate electrode and the first insulating layer;
   a pixel switching gate electrode and a driving gate electrode on the second insulating layer of the pixel portion;
   a third insulating layer covering the pixel switching gate electrode, the driving gate electrode, and the second insulating layer; and
   a storage capacitor overlapping the driving semiconductor layer, wherein
   the storage capacitor includes a first storage capacitive plate that is the driving gate electrode and a second storage capacitive plate that contacts the third insulating layer.

2. The organic light emitting diode display of claim 1, wherein:
   the first storage capacitive plate is on the second insulating layer and overlaps the driving semiconductor layer, and
   the second storage capacitive plate is on the third insulating layer covering the first storage capacitive plate and overlaps the first storage capacitive plate.

3. The organic light emitting diode display of claim 2, wherein the driving semiconductor layer includes a plurality of bent portions.

4. The organic light emitting diode display of claim 3, wherein:
   the driving semiconductor layer includes a plurality of first extension portions extending in a first direction and a plurality of second extension portions extending in a second direction that is different from the first direction, and
   the bent portions connect the first extension portions and the second extension portions.

5. The organic light emitting diode display of claim 2, further comprising:
   a scan line that is on the substrate and that transfers a scan signal;
   a data line and a driving voltage line that cross the scan line and that transfer a data signal and a driving voltage, respectively;
   a pixel switching transistor connected to the scan line and the data line and including the pixel switching semiconductor layer and the pixel switching gate electrode;
   a driving transistor connected to a pixel switching drain electrode of the pixel switching transistor and including the driving semiconductor layer and the driving gate electrode; and
   an organic light emitting diode connected to a driving drain electrode of the driving transistor.

6. The organic light emitting diode display of claim 5, further comprising a peripheral switching transistor including the peripheral switching semiconductor layer and the peripheral switching gate electrode,
   wherein the first insulating layer is between the peripheral switching semiconductor layer and the peripheral switching gate electrode of the peripheral switching transistor.

7. The organic light emitting diode display of claim 6, wherein the first insulating layer and the second insulating layer are between the pixel switching semiconductor layer and the pixel switching gate electrode of the pixel switching transistor.

8. The organic light emitting diode display of claim 7, wherein the first insulating layer and the second insulating layer are between the driving semiconductor layer and the driving gate electrode of the driving transistor.

9. The organic light emitting diode display of claim 8, further comprising a compensation transistor compensating a threshold voltage of the driving transistor and connected to the driving transistor.

10. The organic light emitting diode display of claim 9, further comprising:
    a light emission control transistor turned-on by a light emission control signal transferred by a light emission control line to transfer the driving voltage from the driving transistor to the organic light emitting diode,
    wherein the light emission control transistor is positioned between the driving drain electrode of the driving transistor and the organic light emitting diode.

11. The organic light emitting diode display of claim 10, further comprising:
    an interlayer insulating layer covering the second storage capacitive plate;
    a connection member on the interlayer insulating layer and connected through a contact hole formed in the third insulating layer and the interlayer insulating layer to the first storage capacitive plate, the connection member being connected to a compensation drain electrode of the compensation transistor; and a protective layer covering the interlayer insulating layer and the connection member.

12. The organic light emitting diode display of claim 11, wherein:
   a scan line is on a same layer as the first storage capacitive plate, and
   a data line and a driving voltage line are on a same layer as the connection member.

13. The organic light emitting diode display of claim 12, wherein the driving voltage line is connected through a contact hole formed in the interlayer insulating layer to the second storage capacitive plate.

14. The organic light emitting diode display of claim 13, further comprising:
   an operation control transistor turned-on by a light emission control signal transferred by a light emission control line to transfer the driving voltage to the driving transistor,
   wherein the operation control transistor is positioned between the driving voltage line and a driving source electrode of the driving transistor.

15. The organic light emitting diode display of claim 14, further comprising:
   an initialization transistor turned-on according to a prior scan signal transferred through a prior scan line to transfer an initialization voltage to the driving gate electrode of the driving transistor,
   wherein the initialization transistor is positioned between the initialization voltage line and the driving gate electrode of the driving transistor.

16. The organic light emitting diode display of claim 1, wherein:
   the driving semiconductor layer and the peripheral switching semiconductor layer are coplanar on the substrate, and
   a bottom surface of the driving gate electrode is higher than a bottom surface of the peripheral switching gate electrode.

17. A method of manufacturing an organic light emitting diode display, the method comprising:
   forming a pixel switching semiconductor layer and a bent driving semiconductor layer on a pixel portion on a substrate including the pixel portion and a peripheral portion, and forming a peripheral switching semiconductor layer on the peripheral portion;
   forming a first insulating layer on the pixel switching semiconductor layer, the bent driving semiconductor layer, and the peripheral switching semiconductor layer;
   forming a peripheral switching gate electrode on the first insulating layer of the peripheral portion;
   forming a second insulating layer covering the peripheral switching gate electrode and the first insulating layer;
   forming a pixel switching gate electrode and a driving gate electrode on the second insulating layer of the pixel portion; and
   forming a third insulating layer covering the pixel switching gate electrode, the driving gate electrode, and the second insulating layer; and
   forming a storage capacitor overlapping the driving semiconductor layer, wherein
   the storage capacitor includes a first storage capacitive plate that is the driving gate electrode and a second storage capacitive plate that contacts the third insulating layer.

18. The method of manufacturing an organic light emitting diode display of claim 17, wherein:
   the first storage capacitive plate overlapping the driving semiconductor layer is on the second insulating layer, and
   the second storage capacitive plate overlapping the first storage capacitive plate is on the third insulating layer.

\* \* \* \* \*